(12) United States Patent
Kanakamedala

(10) Patent No.: US 9,716,474 B2
(45) Date of Patent: Jul. 25, 2017

(54) LOW POWER FEED FORWARD AMPLIFIER

(71) Applicant: Texas Instruments Incorporated, Dallas, TX (US)

(72) Inventor: Raja Sekhar Kanakamedala, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/863,204

(22) Filed: Sep. 23, 2015

(65) Prior Publication Data

US 2016/0315589 A1   Oct. 27, 2016

(30) Foreign Application Priority Data

Apr. 24, 2015   (IN) .............................. 2097/CHE/2015

(51) Int. Cl.
*H03F 3/45* (2006.01)
*H03F 1/32* (2006.01)

(52) U.S. Cl.
CPC ....... *H03F 1/3211* (2013.01); *H03F 3/45085* (2013.01); *H03F 3/45502* (2013.01); *H03F 2200/144* (2013.01); *H03F 2201/3218* (2013.01); *H03F 2203/45074* (2013.01); *H03F 2203/45418* (2013.01); *H03F 2203/45424* (2013.01)

(58) Field of Classification Search
CPC ...... H03F 1/3223; H03F 3/45282; H03F 3/68; H03F 2200/144; H03F 2201/3218; H03F 2203/45026; H03F 2203/45074
USPC ........................................... 330/69, 252–261
See application file for complete search history.

(56) References Cited

U.S. PATENT DOCUMENTS

| 4,996,498 A * | 2/1991 | Hanna ................. H03F 3/45479 327/345 |
| 2009/0058527 A1* | 3/2009 | Srinivasa .............. H03F 1/3211 330/259 |
| 2015/0288397 A1* | 10/2015 | Lin ..................... H03F 3/45475 455/308 |

* cited by examiner

*Primary Examiner* — Steven J Mottola
*Assistant Examiner* — Hafizur Rahman
(74) *Attorney, Agent, or Firm* — John R. Pressetto; Charles A. Brill; Frank D. Cimino

(57) ABSTRACT

The disclosure provides a circuit. The circuit includes a primary amplifier. A first common mode detector is coupled to the primary amplifier. A second common mode detector is coupled to the primary amplifier. An error correction circuit is coupled between the second common mode detector and the primary amplifier.

20 Claims, 3 Drawing Sheets

LOW POWER FEED FORWARD AMPLIFIER

CROSS REFERENCES TO RELATED APPLICATIONS

This application claims priority from India provisional patent application No. 2097/CHE/2015 filed on Apr. 24, 2015 which is hereby incorporated by reference in its entirety.

TECHNICAL FIELD

The present disclosure is generally related to amplifiers, and more particularly to a feed forward compensated amplifier.

BACKGROUND

Linear amplifiers are designed to amplify incident signals without adding unwanted distortion products, and producing output signals at significantly higher output levels. In continuous time applications, a high loop gain is required in an amplifier to reduce distortion. The high loop gain is achieved by cascading a large number of gain stages. One technique of compensation in multistage amplifiers is feed forward technique. The feed forward compensated amplifiers because of a high loop gain at signal frequency results in very low distortion.

In feed forward compensated amplifiers, distortion is reduced as amplitude of virtual ground imperfections is very low because of the high loop gain at signal frequency. A high linearity application typically employs multiple stages, and using feed forward amplifiers in such applications requires a large power. The power requirement is increased further if the distortion is required to be reduced.

SUMMARY

According to an aspect of the disclosure, a circuit is disclosed. The circuit includes a primary amplifier. A first common mode detector is coupled to the primary amplifier. A second common mode detector is coupled to the primary amplifier. An error correction circuit is coupled between the second common mode detector and the primary amplifier.

BRIEF DESCRIPTION OF THE VIEWS OF DRAWINGS

Figure 1:
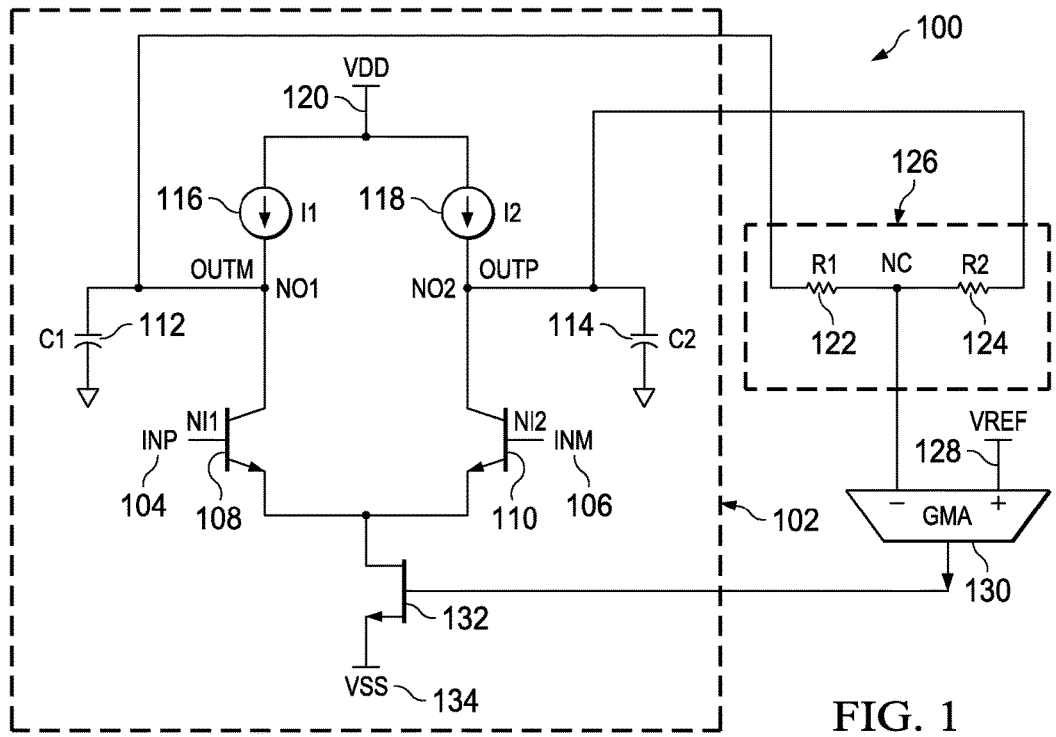
Figure 2:
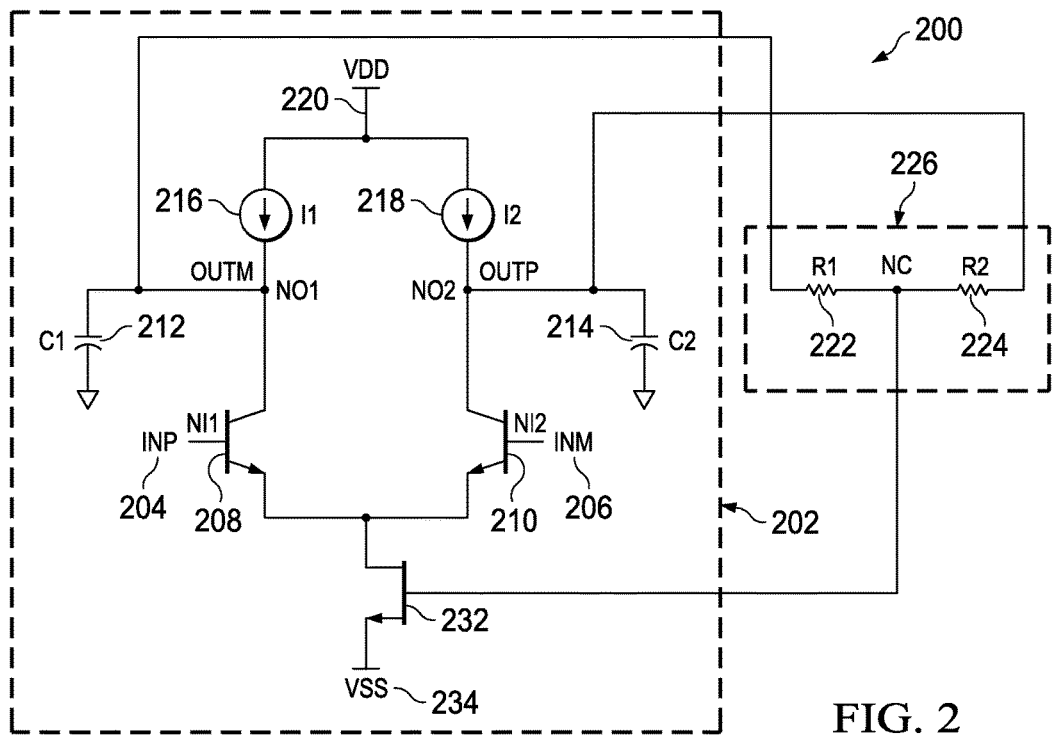
Figure 3:
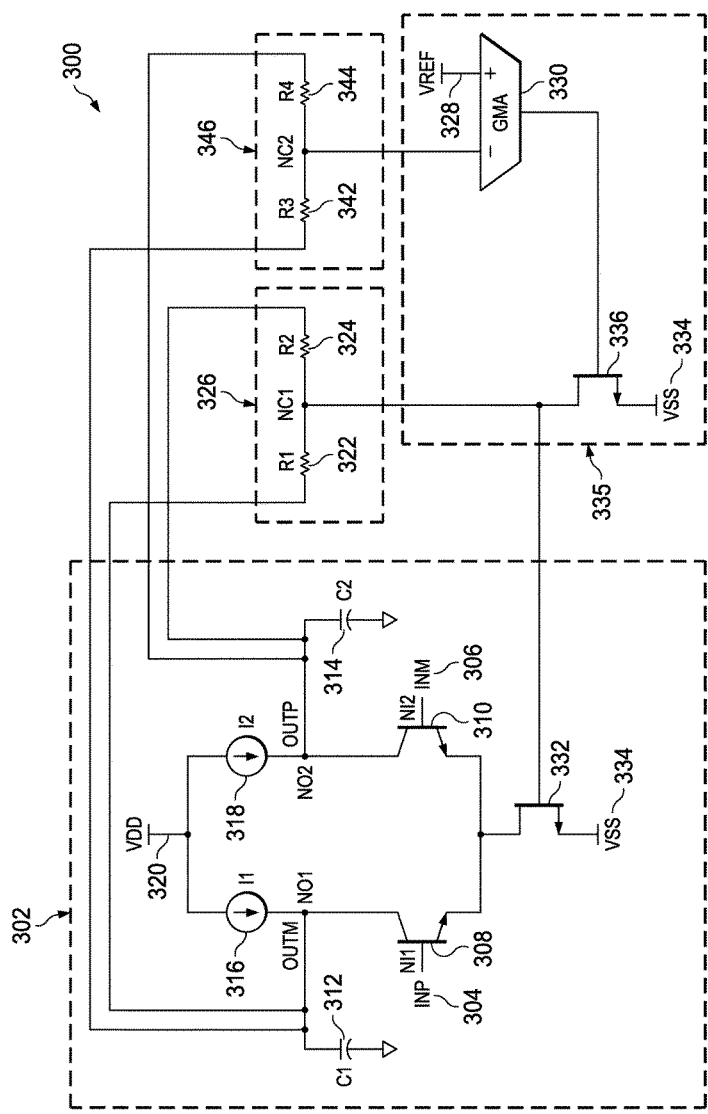
Figure 4:
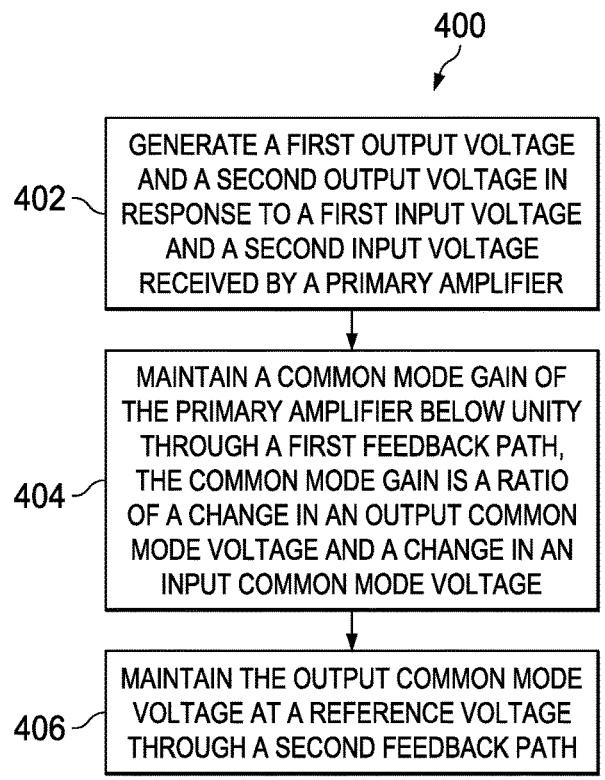
Figure 5:
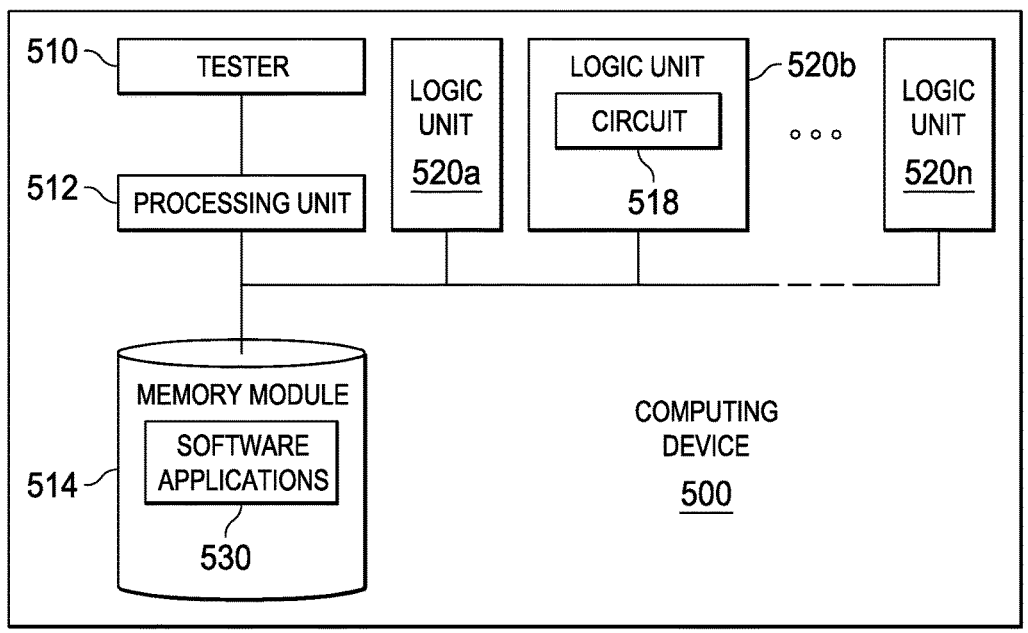

FIG. 1 illustrates a circuit;
FIG. 2 illustrates a circuit, according to an embodiment;
FIG. 3 illustrates a circuit, according to an embodiment;
FIG. 4 is a flowchart to illustrate a method of operation of a circuit, according to an embodiment; and
FIG. 5 illustrates a computing device, according to an embodiment.

DETAILED DESCRIPTION OF THE EMBODIMENTS

FIG. 1 illustrates a circuit 100. The circuit 100 includes a primary amplifier 102, a common mode detector 126, and a secondary amplifier 130. The primary amplifier 102 includes a first BJT (bipolar junction transistor) 108, a second BJT 110 and a tail current source 132. The first BJT 108 receives a first input INP 104 at a first input node NI1, and the second BJT 110 receives a second input INM 106 at a second input node NI2. The primary amplifier 102 generates a first output OUTM at a first output node NO1, and a second output OUTP at a second output node NO2.

A base terminal of the first BJT 108 receives the first input INP 104 and a collector terminal of the first BJT 108 is coupled to the first output node NO1. A base terminal of the second BJT 110 receives the second input INM 106, and a collector terminal of the second BJT 110 is coupled to the second output node NO2. An emitter terminal of each of the first BJT 108 and the second BJT 110 is coupled to the tail current source 132.

A first fixed capacitor C1 112 is coupled between the first output node NO1 and a ground terminal. A second fixed capacitor C2 114 is coupled between the second output node NO2 and the ground terminal. The primary amplifier 102 includes a primary power source VDD 120. A first current source I1 116 is coupled between the primary power source VDD 120 and the first output node NO1. A second current source I2 118 is coupled between the primary power source VDD 120 and the second output node NO2. In one example, the first current source I1 116 and the second current source I2 118 generate equal current.

The common mode detector 126 is coupled to the primary amplifier 102. The common mode detector 126 includes a first resistor R1 122 and a second resistor R2 124. In one example, a resistance of the first resistor R1 122 is equal to a resistance of the second resistor R2 124. The first resistor R1 122 is coupled between the first output node NO1 and a common node NC. The second resistor R2 124 is coupled between the second output node NO2 and the common node NC. The secondary amplifier 130 is coupled to the common node NC in the common mode detector 126. The secondary amplifier 130 receives a reference voltage Vref 128.

The tail current source 132 is a transistor whose gate terminal is coupled to the secondary amplifier 130. A source terminal of the transistor is coupled to a secondary power source Vss 134. A drain terminal of the transistor is coupled to the emitter terminal of each of the first BJT 108 and the second BJT 110.

The operation of the circuit 100 illustrated in FIG. 1 is explained now. The primary amplifier 102 generates the first output OUTM and the second output OUTP in response to the first input INP 104 and the second input INM 106. An input common mode voltage is measured from the first input INP 104 and the second input INM 106. An output common mode voltage is measured from the first output OUTM and the second output OUTP.

A common mode gain is a ratio of a change in the output common mode voltage and a change in the input common mode voltage. The common mode gain of the primary amplifier 102 is required to be maintained below unity (1) at all frequencies to ensure stability of a feedback amplifier of which circuit 100 is a part. In addition, for maximum differential swing of the primary amplifier 102, the output common mode voltage is to be maintained at a defined value. Thus, even when the first input INP 104 and the second input INM 106 changes because of system variations or PVT (process, voltage and temperature) variations, it is required that a voltage level of the output common mode voltage is maintained.

The common mode detector 126 and the secondary amplifier 130 are utilized to achieve the above mentioned conditions. A voltage at the common node NC is the output common mode voltage. In one example, the output common mode voltage is an average of the first output OUTM and the second output OUTP. The output common mode voltage is compared with the reference voltage Vref 128 in the secondary amplifier 130. The secondary amplifier 130 provides a control signal to the gate terminal of the tail current source 132. A current through the tail current source 132 is adjusted to compensate for the changes in the input common mode voltage. The current through the tail current source 132 is also adjusted to compensate for PVT and system variations.

The secondary amplifier 130 is a high DC gain and high bandwidth amplifier. The secondary amplifier 130 is needed to provided high DC accuracy and high loop gain, which are required to suppress high frequency input common mode voltage variations. Hence, a large power is required to drive the secondary amplifier 130. In one example, the secondary amplifier 130 requires around 4 mA of current for efficient functioning.

FIG. 2 illustrates a circuit 200, according to an embodiment. In one example, the circuit 200 is a feed forward amplifier. The circuit 200 includes a primary amplifier 202, and a common mode detector 226. The primary amplifier 202 includes a first BJT (bipolar junction transistor) 208, a second BJT 210 and a tail current source 232. The first BJT 208 receives a first input INP 204 at a first input node NI1, and the second BJT 210 receives a second input INM 206 at a second input node NI2. The primary amplifier 202 generates a first output OUTM at a first output node NO1, and a second output OUTP at a second output node NO2. In one example, the primary amplifier 202 is a differential transconductance amplifier. In another example, the circuit 200 includes a first MOS transistor instead of the first BJT 208, and a second MOS transistor instead of the second BJT 210.

A base terminal of the first BJT 208 receives the first input INP 204 and a collector terminal of the first BJT 208 is coupled to the first output node NO1. A base terminal of the second BJT 210 receives the second input INM 206, and a collector terminal of the second BJT 210 is coupled to the second output node NO2. An emitter terminal of each of the first BJT 208 and the second BJT 210 is coupled to the tail current source 232.

A first fixed capacitor C1 212 is coupled between the first output node NO1 and a ground terminal. A second fixed capacitor C2 214 is coupled between the second output node NO2 and the ground terminal. The primary amplifier 202 includes a primary power source VDD 220. A first current source I1 216 is coupled between the primary power source VDD 220 and the first output node NO1. A second current source I2 218 is coupled between the primary power source VDD 220 and the second output node NO2. In one example, the first current source I1 216 and the second current source I2 218 generate equal current.

The common mode detector 226 is coupled to the primary amplifier 202. The common mode detector 226 includes a first resistor R1 222 and a second resistor R2 224. In one example, a resistance of the first resistor R1 222 is equal to a resistance of the second resistor R2 224. The first resistor R1 222 is coupled between the first output node NO1 and a common node NC. The second resistor R2 224 is coupled between the second output node NO2 and the common node NC. The tail current source 232 is coupled to the common node NC in the common mode detector 226.

The tail current source 232 is a transistor whose gate terminal is coupled to the common node NC. A source terminal of the transistor is coupled to a secondary power source Vss 234. A drain terminal of the transistor is coupled to the emitter terminal of each of the first BJT 208 and the second BJT 210. The circuit 200 may include one or more additional components known to those skilled in the relevant art and are not discussed here for simplicity of the description.

The operation of the circuit 200 illustrated in FIG. 2 is explained now. The primary amplifier 202 generates the first output OUTM and the second output OUTP in response to the first input INP 204 and the second input INM 206. An input common mode voltage is measured from the first input INP 204 and the second input INM 206. An output common mode voltage is measured from the first output OUTM and the second output OUTP.

A common mode gain is a ratio of a change in the output common mode voltage and a change in the input common mode voltage. The common mode gain of the primary amplifier 202 is required to be maintained below unity (1) at all frequencies to ensure stability of a feedback amplifier of which circuit 200 is a part. In addition, for maximum differential swing of the primary amplifier 202, the output common mode voltage is to be maintained at a defined value. Thus, even when the first input INP 204 and the second input INM 206 changes because of system variations or PVT (process, voltage and temperature) variations, it is required that a voltage level of the output common mode voltage is maintained.

The common mode detector 226 is utilized to achieve the above mentioned conditions. A voltage at the common node NC is the output common mode voltage. In one example, the output common mode voltage is an average of the first output OUTM and the second output OUTP. The output common mode voltage is provided to the gate terminal of the tail current source 232. A current through the tail current source 232 is adjusted to compensate for the changes in the input common mode voltage. The current through the tail current source 232 is also adjusted to compensate for PVT and system variations. This maintains the output common mode voltage at the defined value.

In the circuit 200, a secondary amplifier is not used and hence power consumption in the circuit 200 is much lesser than a power consumption in the circuit 100. The common mode gain of the primary amplifier 202 is maintained below unity. In one example, a worst case common mode attenuation of the circuit 200 is between 3 and 5. The circuit 200 maintains the output common mode voltage within a defined range of a threshold voltage of the tail current source 232. When a threshold voltage of the transistor is Vt, the common mode voltage is set to within a defined range of Vt.

FIG. 3 illustrates a circuit 300, according to an embodiment. In one example, the circuit 300 is a feed forward amplifier. The circuit 300 includes a primary amplifier 302, a first common mode detector 326, a second common mode detector 346 and an error correction circuit 335. The primary amplifier 302 includes a first BJT (bipolar junction transistor) 308, a second BJT 310 and a tail current source 332. The first BJT 308 receives a first input INP 304 at a first input node NI1, and the second BJT 310 receives a second input INM 306 at a second input node NI2. The primary amplifier 302 generates a first output OUTM at a first output node NO1, and a second output OUTP at a second output node NO2. In one example, the primary amplifier 302 is a differential transconductance amplifier. In another example, the circuit 300 includes a first MOS transistor instead of the first BJT 308, and a second MOS transistor instead of the second BJT 310.

A base terminal of the first BJT 308 receives the first input INP 304 and a collector terminal of the first BJT 308 is coupled to the first output node NO1. A base terminal of the second BJT 310 receives the second input INM 306, and a collector terminal of the second BJT 310 is coupled to the second output node NO2. An emitter terminal of each of the first BJT 308 and the second BJT 310 is coupled to the tail current source 332.

A first fixed capacitor C1 312 is coupled between the first output node NO1 and a ground terminal. A second fixed capacitor C2 314 is coupled between the second output node NO2 and the ground terminal. In one example, a capacitance of the first fixed capacitor C1 312 and the second fixed capacitor C2 314 are equal. The primary amplifier 302 includes a primary power source VDD 320. A first current source I1 316 is coupled between the primary power source VDD 320 and the first output node NO1. A second current source I2 318 is coupled between the primary power source VDD 320 and the second output node NO2. In one example, the first current source I1 316 and the second current source I2 318 generate equal current.

The first common mode detector 326 and the second common mode detector 346 are coupled to the primary amplifier 302. Each of the first common mode detector 326 and the second common mode detector 346 is coupled between the first output node NO1 and the second output node NO2. The first common mode detector 326 includes a first resistor R1 322 and a second resistor R2 324. In one example, a resistance of the first resistor R1 322 is equal to a resistance of the second resistor R2 324. The first resistor R1 322 is coupled between the first output node NO1 and a first common node NC1. The second resistor R2 324 is coupled between the second output node NO2 and the first common node NC1. The tail current source 332 is coupled to the first common node NC1 in the first common mode detector 326.

The second common mode detector 346 includes a third resistor R3 342 and a fourth resistor R4 344. In one example, a resistance of the third resistor R3 342 is equal to a resistance of the fourth resistor R4 344. In another example, the resistance of the first resistor R1 322, the second resistor R2 324, the third resistor R3 342 and the fourth resistor R4 344 is equal. The third resistor R3 342 is coupled between the first output node NO1 and a second common node NC2. The fourth resistor R4 344 is coupled between the second output node NO2 and the second common node NC2. The first common node NC1 is coupled to the primary amplifier 302, and the second common node NC2 is coupled to the error correction circuit 335.

The error correction circuit 335 is coupled between the second common mode detector 346 and the primary amplifier 302. The error correction circuit 335 includes a secondary amplifier 330 and a secondary current source 336. The secondary amplifier 330 is coupled to the second common node NC2 in the second common mode detector 346. The secondary amplifier 330 receives a reference voltage Vref 328.

The secondary current source 336 is coupled between the secondary amplifier 330 and the tail current source 332. The secondary current source 336 is a second transistor whose gate terminal is coupled to the secondary amplifier 330, whose source terminal is coupled to a secondary power source Vss 334 and whose drain terminal is coupled to the tail current source 332.

The tail current source 332 is a first transistor whose gate terminal is coupled to the first common node NC1 and the drain terminal of the second transistor. A source terminal of the first transistor is coupled to the secondary power source Vss 334. A drain terminal of the first transistor is coupled to the emitter terminal of each of the first BJT 308 and the second BJT 310. The circuit 300 may include one or more additional components known to those skilled in the relevant art and are not discussed here for simplicity of the description.

The operation of the circuit 300 illustrated in FIG. 3 is explained now. The primary amplifier 302 generates the first output OUTM and the second output OUTP in response to the first input INP 304 and the second input INM 306. An input common mode voltage is measured from the first input INP 304 and the second input INM 306. An output common mode voltage is measured from the first output OUTM and the second output OUTP.

A common mode gain is a ratio of a change in the output common mode voltage and a change in the input common mode voltage. The common mode gain of the primary amplifier 302 is required to be maintained below unity (1) at all frequencies to ensure stability of a feedback amplifier of which circuit 300 is a part. In addition, for maximum differential swing of the primary amplifier 302, the output common mode voltage is to be maintained at a defined value. Thus, even when the first input INP 304 and the second input INM 306 changes because of system variations or PVT (process, voltage and temperature) variations, it is required that a voltage level of the output common mode voltage is maintained.

The first common mode detector 326, the second common mode detector 346 and the error correction circuit 335 are utilized to achieve the above mentioned conditions. The first common mode detector 326 along with the tail current source 332 forms a first feedback path. The second common mode detector 346, the secondary amplifier 330 and the secondary current source 336 forms a second feedback path. A voltage generated at the first common node NC1 is a first voltage, and a voltage generated at the second common node NC2 is a second voltage.

The common mode gain of the primary amplifier 302 is maintained below unity (one) through the first feedback path. The first voltage generated at the first common node NC1 is provided to the gate terminal of the first transistor (tail current source 332). A current through the first transistor is adjusted when the input common mode voltage is changed. This maintains the common mode gain of the primary amplifier 302 below unity.

The output common mode voltage is maintained at the reference voltage Vref 328 through the second feedback path. The second voltage is generated at the second common node NC2. The secondary amplifier 330 compares the second voltage and the reference voltage Vref 328 to generate a control signal. The control signal is provided to the gate terminal of the second transistor (secondary current source 336). A current through the second transistor is adjusted to compensate for process, voltage and temperature (PVT) variations. Thus, the output common mode voltage is maintained at the reference voltage Vref 328.

In the circuit 300, the first feedback path is used for maintaining the common mode gain of the primary amplifier 102 below unity. Thus, a bandwidth of operation of the first feedback path would be of order of GHz. Hence, the second feedback path is stabilized with very low power. In one example, a current of the order of uA is required by the secondary amplifier 330. When the circuit 300 is used in applications requiring high linearity, the power needed is very less as compared to the circuit 100. The circuit 300 can also be used in a band pass delta sigma modulator to reduce intermodulation distortion. In one example, an improvement of 10 dB in SNR (signal to noise ratio) is achieved in the band pass delta sigma modulator using the circuit 300. Also, a power required to drive the circuit 300, in one example, is 50 times less than used by conventional amplifiers.

FIG. 4 is a flowchart 400 to illustrate a method of operation of a circuit, according to an embodiment. The flowchart 400 is explained in connection with the circuit 300. At step 402, a first output and a second output are generated in response to a first input and a second input received by a primary amplifier. In circuit 300, the primary amplifier 302 generates the first output OUTM and the second output OUTP in response to the first input INP 304 and the second input INM 306.

At step 404, a common mode gain of the primary amplifier is maintained below unity through a first feedback path. The common mode gain is a ratio of a change in an output common mode voltage and a change in an input common mode voltage. The input common mode voltage is measured from the first input and the second input. The output common mode voltage is measured from the first output and the second output.

In circuit 300, the first common mode detector 326 along with the tail current source 332 forms the first feedback path. A voltage generated at the first common node NC1 is a first voltage, and a voltage generated at the second common node NC2 is a second voltage. The first voltage generated at the first common node NC1 is provided to the gate terminal of the first transistor (tail current source 332). A current through the first transistor is adjusted when the input common mode voltage is changed. This maintains the common mode gain of the primary amplifier 302 below unity.

At step 406, the output common mode voltage is maintained at a reference voltage through a second feedback path. In circuit 300, the second common mode detector 346, the secondary amplifier 330 and the secondary current source 336 forms the second feedback path. The second voltage is generated at the second common node NC2. The secondary amplifier 330 compares the second voltage and the reference voltage Vref 328 to generate a control signal. The control signal is provided to the gate terminal of the second transistor (secondary current source 336). A current through the second transistor is adjusted to compensate for process, voltage and temperature (PVT) variations. Thus, the output common mode voltage is maintained at the reference voltage Vref 328.

FIG. 5 illustrates a computing device 500, according to an embodiment. The computing device 500 is, or is incorporated into, a mobile communication device, such as a mobile phone, a personal digital assistant, a transceiver, a personal computer, or any other type of electronic system. The computing device 500 may include one or more additional components known to those skilled in the relevant art and are not discussed here for simplicity of the description.

In some embodiments, the computing device 500 comprises a megacell or a system-on-chip (SoC) which includes a processing unit 512 such as a CPU (Central Processing Unit), a memory module 514 (e.g., random access memory (RAM)) and a tester 510. The processing unit 512 can be, for example, a CISC-type (Complex Instruction Set Computer) CPU, RISC-type CPU (Reduced Instruction Set Computer), or a digital signal processor (DSP).

The memory module 514 (which can be memory such as RAM, flash memory, or disk storage) stores one or more software applications 530 (e.g., embedded applications) that, when executed by the processing unit 512, performs any suitable function associated with the computing device 500. The tester 510 comprises logic that supports testing and debugging of the computing device 500 executing the software applications 530.

For example, the tester 510 can be used to emulate a defective or unavailable component(s) of the computing device 500 to allow verification of how the component(s), were it actually present on the computing device 500, would perform in various situations (e.g., how the component(s) would interact with the software applications 530). In this way, the software applications 530 can be debugged in an environment which resembles post-production operation.

The processing unit 512 typically comprises memory and logic which store information frequently accessed from the memory module 514. The computing device 500 includes a plurality of logic units illustrated as 520a, 520b to 520n. The plurality of logic units are coupled to the processing unit 512 and the memory module 514. A logic unit can be, for example, one of the following, but not limited to, an ADC (analog to digital converter), a receiver, and a delta sigma modulator. At least one logic unit of the plurality of logic units includes a circuit 518. The circuit 518 is similar in connection and operation to the circuit 300. The circuit 518 includes a primary amplifier, a first feedback path and a second feedback path.

A common mode gain of the primary amplifier is maintained below unity (one) through the first feedback path. An output common mode voltage is maintained at a reference voltage through the second feedback path. A bandwidth of operation of the first feedback path would be of order of GHz. Hence, the second feedback path is stabilized with very low power. In one example, a current of the order of uA is required by the second feedback path.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A circuit comprising:
   a primary amplifier;
   a first common mode detector coupled to the primary amplifier;
   a second common mode detector coupled to the primary amplifier; and
   an error correction circuit coupled between the second common mode detector and the primary amplifier, wherein the primary amplifier comprises a tail current source and a gate terminal of the tail current source is coupled to the first common mode detector and to a second transistor in the error correction circuit.

2. The circuit of claim 1, wherein the primary amplifier comprises a first input node, a second input node, a first output node and a second output node.

3. The circuit of claim 1, wherein the primary amplifier is configured to receive a first input and a second input at the first input node and the second input node respectively, and wherein an input common mode voltage is measured from the first input and the second input.

4. The circuit of claim 1, wherein the primary amplifier is configured to generate a first output and a second output at the first output node and the second output node respectively, and wherein an output common mode voltage is measured from the first output and the second output.

5. The circuit of claim 1, wherein each of the first common mode detector and the second common mode detector is coupled between the first output node and the second output node.

6. The circuit of claim 1, wherein the first common mode detector comprises:
a first resistor coupled between the first output node and a first common node; and
a second resistor coupled between the first common node and the second output node, wherein a first voltage is measured at the first common node.

7. The circuit of claim 1, wherein the second common mode detector comprises:
a third resistor coupled between the first output node and a second common node; and
a fourth resistor coupled between the second common node and the second output node, wherein a second voltage is measured at the second common node.

8. The circuit of claim 1, wherein the first common node of the first common mode detector is coupled to the primary amplifier, and the second common node of the second common mode detector is coupled to the error correction circuit.

9. The circuit of claim 1, wherein the tail current source is a first transistor whose gate terminal is coupled to the first common node and to the error correction circuit and whose source terminal is coupled to a secondary power source.

10. The circuit of claim 9, wherein a current through the first transistor is adjusted when the input common mode voltage is changed such that a common mode gain is maintained below unity, the common mode gain is a ratio of a change in the output common mode voltage and a change in the input common mode voltage.

11. The circuit of claim 1, wherein the error correction circuit comprises:
a secondary amplifier coupled to the second common mode detector and configured to compare the second voltage and a reference voltage to generate a control signal; and
a secondary current source coupled between the secondary amplifier and the tail current source, and configured to receive the control signal.

12. The circuit of claim 11, wherein the secondary current source is the second transistor whose gate terminal is coupled to the secondary amplifier, whose source terminal is coupled to the secondary power source and whose drain terminal is coupled to the gate terminal of the first transistor.

13. The circuit of claim 12, wherein a current through the second transistor is adjusted to maintain the output common mode voltage at the reference voltage.

14. A method comprising:
generating a first output and a second output in response to a first input and a second input received by a primary amplifier;
maintaining a common mode gain of the primary amplifier below unity through a first feedback path, the common mode gain is a ratio of a change in an output common mode voltage and a change in an input common mode voltage; and
maintaining the output common mode voltage at a reference voltage through a second feedback path, wherein the first feedback path comprises a first transistor, and the second feedback path comprises a second transistor.

15. The method of claim 14 further comprising:
measuring the input common mode voltage from the first input and the second input; and
measuring the output common mode voltage from the first output and the second output.

16. The method of claim 14, wherein maintaining the common mode gain below unity through the first feedback path further comprises:
providing a first voltage to a gate terminal of the first transistor, the primary amplifier includes the first transistor, and the first transistor is coupled to a secondary power source; and
adjusting a current through the first transistor when the input common mode voltage is changed.

17. The method of claim 14, wherein maintaining the output common mode voltage at the reference voltage through the second feedback path comprises:
comparing a second voltage and the reference voltage to generate a control signal;
providing the control signal to a gate terminal of the second transistor; and
adjusting a current through the second transistor to compensate for process, voltage and temperature (PVT) variations.

18. The method of claim 14, wherein a drain terminal of the second transistor is coupled to the gate terminal of the first transistor.

19. A computing device comprising:
a processing unit;
a memory module coupled to the processing unit; and
a plurality of logic units coupled to the processing unit and the memory module, at least one logic unit of the plurality of logic units comprising a circuit, the circuit comprising:
a primary amplifier;
a first common mode detector coupled to the primary amplifier;
a second common mode detector coupled to the primary amplifier; and
an error correction circuit coupled between the second common mode detector and the primary amplifier, and each of the first common mode detector and the second common mode detector is coupled between a first output node and a second output node.

20. The computing device of claim 19, wherein the primary amplifier is configured to generate a first output and a second output at the first output node and the second output node respectively.

* * * * *